(12) United States Patent
Roy et al.

(10) Patent No.: US 9,692,378 B2
(45) Date of Patent: Jun. 27, 2017

(54) PROGRAMMABLE GAIN AMPLIFIER WITH ANALOG GAIN TRIM USING INTERPOLATION

(71) Applicant: Texas Instruments Incorporated, Dallas, TX (US)

(72) Inventors: Aniruddha Roy, Karnataka (IN); Nitin Agarwal, Karnataka (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/258,034

(22) Filed: Sep. 7, 2016

(65) Prior Publication Data
US 2017/0149397 A1     May 25, 2017

Related U.S. Application Data

(60) Provisional application No. 62/257,853, filed on Nov. 20, 2015.

(51) Int. Cl.
*H03G 1/00*     (2006.01)
*H03F 3/45*     (2006.01)

(52) U.S. Cl.
CPC ....... *H03G 1/0088* (2013.01); *H03F 3/45179* (2013.01); *H03F 2203/45026* (2013.01)

(58) Field of Classification Search
CPC ................ H03G 1/0088; H03F 3/45179
USPC ............................................. 330/284, 282, 86
See application file for complete search history.

(56) References Cited

U.S. PATENT DOCUMENTS

| | | | |
|---|---|---|---|
| 3,795,825 A | 3/1974 | McGhee | |
| 4,396,890 A | 8/1983 | Kato et al. | |
| 5,075,633 A * | 12/1991 | Bowers | H03F 3/347 330/144 |
| 5,233,309 A | 8/1993 | Spitalny et al. | |
| 5,387,879 A | 2/1995 | Satoh | |
| 5,481,225 A | 1/1996 | Lumsden et al. | |
| 5,928,150 A * | 7/1999 | Call | G01T 1/161 250/336.1 |
| 6,310,518 B1 * | 10/2001 | Swanson | H03M 1/185 330/282 |
| 6,424,209 B1 * | 7/2002 | Gorecki | H03H 11/1291 327/337 |
| 7,302,246 B2 | 11/2007 | Tseng et al. | |
| 7,352,242 B1 | 4/2008 | Hughes | |
| 7,545,209 B2 | 6/2009 | Hughes | |
| 7,679,048 B1 * | 3/2010 | Aziz | G01J 5/02 250/252.1 |
| 2003/0215033 A1 | 11/2003 | Drapkin et al. | |

(Continued)

*Primary Examiner* — Patricia T Nguyen
(74) *Attorney, Agent, or Firm* — John R. Pessetto; Charles A. Brill; Frank D. Cimino (57) ABSTRACT

Disclosed examples include programmable gain amplifier (PGA) circuits with an operation amplifier circuit having a first amplifier input and a second amplifier input including a plurality of second input nodes, a resistor array including a plurality of resistor sections connected in series with one another between the amplifier output and a reference voltage node, and a trim select circuit coupled between the second amplifier input and the resistor array circuit to deliver a feedback voltage signal to each individual one of the second input nodes from a given selected one of a plurality of the tap points of the resistor array circuit according to a trim code to provide analog gain trimming by interpolation.

23 Claims, 12 Drawing Sheets

(56) References Cited

U.S. PATENT DOCUMENTS

| | | | | |
|---|---|---|---|---|
| 2004/0200961 A1* | 10/2004 | Parrish | ............... | G01J 5/02 |
| | | | | 250/338.1 |
| 2009/0172242 A1* | 7/2009 | Piasecki | ............ | G06F 13/4208 |
| | | | | 710/317 |
| 2012/0127009 A1* | 5/2012 | Pagnanelli | ............ | H03M 3/468 |
| | | | | 341/143 |

* cited by examiner

| TRIM CODE 124 | # $V_{HI}$ CONNECTIONS | # $V_{MID}$ CONNECTIONS | # $V_{LO}$ CONNECTIONS |
|---|---|---|---|
| 0 | 0 | 0 | 16 |
| 1 | 0 | 2 | 14 |
| 2 | 0 | 4 | 12 |
| 3 | 0 | 6 | 10 |
| 4 | 0 | 8 | 8 |
| 5 | 0 | 10 | 6 |
| 6 | 0 | 12 | 4 |
| 7 | 0 | 14 | 2 |
| 8 | 0 | 16 | 0 |
| 9 | 2 | 14 | 0 |
| 10 | 4 | 12 | 0 |
| 11 | 6 | 10 | 0 |
| 12 | 8 | 8 | 0 |
| 13 | 10 | 6 | 0 |
| 14 | 12 | 4 | 0 |
| 15 | 14 | 2 | 0 |

| TRIM CODE 124 | # $V_{HI2}$ CONNECTIONS | # $V_{HI1}$ CONNECTIONS | # $V_{MID}$ CONNECTIONS | # $V_{LO1}$ CONNECTIONS | # $V_{LO2}$ CONNECTIONS |
|---|---|---|---|---|---|
| 0 | 0 | 0 | 0 | 0 | 16 |
| 1 | 0 | 0 | 0 | 4 | 12 |
| 2 | 0 | 0 | 0 | 8 | 8 |
| 3 | 0 | 0 | 0 | 12 | 4 |
| 4 | 0 | 0 | 0 | 16 | 0 |
| 5 | 0 | 0 | 4 | 12 | 0 |
| 6 | 0 | 0 | 8 | 8 | 0 |
| 7 | 0 | 0 | 12 | 4 | 0 |
| 8 | 0 | 0 | 16 | 0 | 0 |
| 9 | 0 | 4 | 12 | 0 | 0 |
| 10 | 0 | 8 | 8 | 0 | 0 |
| 11 | 0 | 12 | 4 | 0 | 0 |
| 12 | 0 | 16 | 0 | 0 | 0 |
| 13 | 4 | 12 | 0 | 0 | 0 |
| 14 | 8 | 8 | 0 | 0 | 0 |
| 15 | 12 | 4 | 0 | 0 | 0 |

PROGRAMMABLE GAIN AMPLIFIER WITH ANALOG GAIN TRIM USING INTERPOLATION

Under 35 U.S.C. §119, this application claims priority to, and the benefit of, U.S. Provisional Patent Application Ser. No. 62/257,853 that was filed on Nov. 20, 2015 and is entitled "USE OF INTERPOLATION FOR ON-CHIP ANALOG GAIN TRIM IN PROGRAMMABLE GAIN AMPLIFIER", the entirety of which is incorporated by reference herein.

BACKGROUND

Programmable gain amplifiers (PGAs) are used in a variety of different electronic systems to provide an adjustable or programmable gain for amplifying an input signal. For example, PGAs can be used as an input amplifier for an analog-to-digital converter (A/D or ADC) to accommodate a wide dynamic range of input signal levels. PGAs typically employ an operational amplifier or op amp with an adjustable resistive feedback network to set the amplifier gain. The op amp receives an input signal at a first input, and provides an output signal that is related to the input signal based on the gain. The gain is determined by the impedance of the feedback path between the output and a second op amp input. Conventional PGAs employ switches to change the selection of feedback resistors to adjust the gain. However, on-chip mismatch between resistor components causes gain errors which might be unacceptable for certain applications.

SUMMARY

Disclosed examples include programmable gain amplifier circuits with an operation amplifier circuit having a first amplifier input and a second amplifier input including a plurality of second input nodes, a resistor array including a plurality of resistor sections connected in series with one another between the amplifier output and a reference voltage node, and a trim select circuit coupled between the second amplifier input and the resistor array circuit to deliver a feedback voltage signal to each individual one of the second input nodes from a given selected one of a plurality of the tap points of the resistor array circuit according to a trim code to provide analog gain trimming by interpolation.

DETAILED DESCRIPTION

In the drawings, like reference numerals refer to like elements throughout, and the various features are not necessarily drawn to scale. In the following discussion and in the claims, the terms "including", "includes", "having", "has", "with", or variants thereof are intended to be inclusive in a manner similar to the term "comprising", and thus should be interpreted to mean "including, but not limited to . . . " Also, the terms "couple", "couples", or "coupled" are intended to include indirect or direct electrical or mechanical connection or combinations thereof. For example, if a first device couples to or is coupled with a second device, that connection may be through a direct electrical connection, or through an indirect electrical connection via one or more intervening devices and connections.

Disclosed PGA examples address gain errors caused by on-chip mismatch between resistor components by gain error trimming through interpolation, and can also be used to address gain errors due to low op amp DC gain. In many practical situations, PGA gain accuracy depends primarily on the matching of resistor ratios in the feedback path. For integrated circuit implementations of a reasonable area, the on-chip resistor mismatch can be of the order of 1%. Trim circuitry can be used to enhance PGA gain accuracy using switching circuitry to change a gain selection tap from a resistor array in the feedback path. Precise trimming capability can be improved by using resistor array components of very small resistance values to allow precise trimming through switched tap selection. However, realizing very small resistor resolution is complex and difficult in practice, and requires a large area of an integrated circuit. Process limitations prevent using arbitrarily small resistance values. In addition, small resistances are typically realized using parallel combinations of some unit resistance, which increases the overall PGA chip area. Large area resistor array circuits can also slow the response time of the feedback network due to large parasitic capacitors. Switch selected tap points in a feedback resistor array with high trim accuracy cannot meet the bandwidth requirements of many PGA applications, such as for input amplifiers in high-speed analog to digital converter systems or chips. Software can be used to correct sampled PGA output data to address gain errors. However, this approach involves post-processing using software multiplication operations that increase the latency in the real time control applications. Another approach involves switching between two resistor networks in a duty-cycled manner so that the average gain error becomes zero. This technique does not need small resistor resolution for trimming. However, certain applications require every sample of a PGA output to be error-free, and this scheme cannot meet this requirement because it uses averaging based correction and not instantaneous correction.

Figure 1:
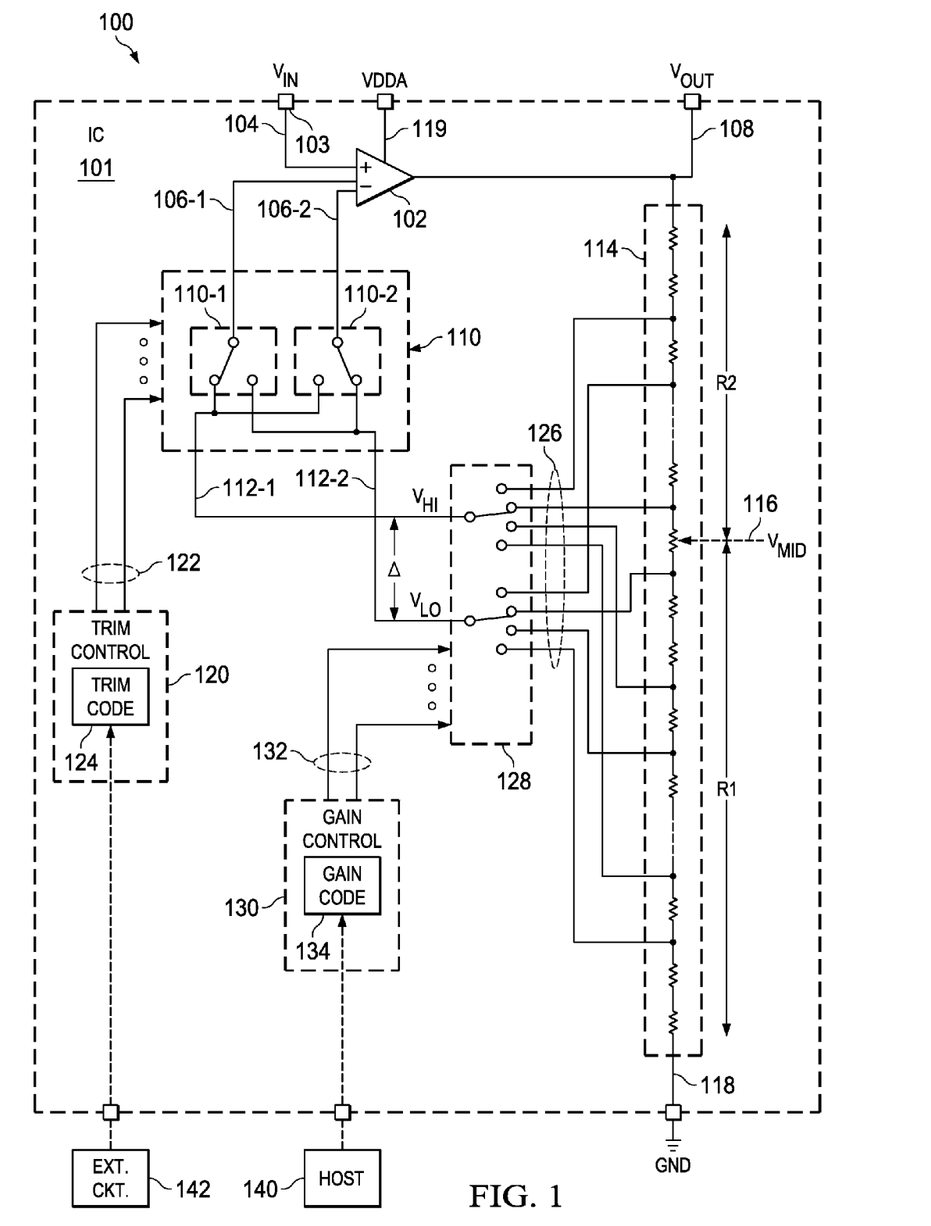
FIG. 1 is a schematic diagram of a programmable gain amplifier circuit with a trim selection circuit to provide interpolated feedback to a segmented op amp input from two resistor array tap points according to an embodiment of the invention.

FIG. 1 shows a programmable gain amplifier circuit 100 implemented in an integrated circuit (IC) 101. The circuit 100 includes a trim select circuit 110 coupled between an amplifier (e.g., op amp) 102 and a segmented resistor array circuit 114 to provide feedback at a segmented op amp input 106 according to a trim code 124 to provide analog gain trimming by interpolation. In one example, the trim select circuit 110 operates as an analog multiplexer. The PGA circuit 100 provides a gain trimming solution that allows fine granularity of gain adjustment while avoiding or mitigating area penalties, data latency and post-processing problems of conventional resistive or software trimming techniques. The disclosed PGA circuits avoid output post-processing and resulting latency by correcting errors at the source, and also avoid the complexity and size penalties of realizing very small resolution resistor segments in the resistor array. The circuit 100 of FIG. 1 provides op amp input pair-based interpolation to trim the gain error. The disclosed trim techniques can be used with any gain adjustment setting or selection by a gain select circuit 128, and can be employed in combination with different types of resistor arrays 114.

The IC 101 in FIG. 1 includes an input terminal 103 that can be connected to an input signal source to receive an input signal $V_{IN}$. The input terminal 103 can be an IC pin or pad in one example, and the IC 101 includes multiple pins or pads referred to herein as terminals. The input terminal 103 is connected to deliver the input signal $V_{IN}$ to a non-inverting (+) first input 104 of the op amp 102. The IC 101 also includes one or more power supply connections, such as a terminal to receive an analog supply voltage VDDA, as well as a common or ground reference terminal at a reference voltage node 118 for connection to a ground signal GND. The op amp 102 in one example has a power connection 119 connected to the supply voltage VDDA. The resistor array 114 in this example has a lower end connected to the reference voltage node 118. The op amp 102 includes an inverting (−) second amplifier input 106 with an integer number N second input nodes 106, where N is greater than 1. The op amp 102 also includes an amplifier output 108 that provides an output signal $V_{OUT}$. The IC 101 in FIG. 1 is a dedicated PGA chip and the output 108 is connected to an output terminal of the IC 101. In another example, the IC 101 includes further circuitry (not shown) such as a sample and hold circuit and an analog to digital converter connected to the amplifier output 108 to receive the output signal $V_{OUT}$ for conversion to digital values. In other examples, the IC 101 includes other circuitry (not shown) connected to provide the amplifier input signal $V_{IN}$ to the first amplifier input 104 for amplification.

The resistor array 114 in FIG. 1 is a segmented circuit including a series-connected string of unit resistor elements or segments between the amplifier output 108 and the reference voltage node 118. Specific nodes or tap points 126 separate the individual resistor segments in the array circuit 114 to allow specific nodes to be tapped or connected to set resistor ratios in the feedback circuit of the op amp 102 to set the PGA gain. A group or set of two tap points 126 is selected by a gain select circuit 128 for each setting defined by a gain code 134. The trim select circuit 110 connects a selected pair of tap points from the resistor array 114 with a pair of inverting input segments 106-1 and 106-2 of the op amp 102. In this example, the trim select circuit 110 includes a first switch circuit 110-1 and a second switch circuit 110-2. The first switch circuit 110-1 operates according to the trim code 124 to selectively connect one of the inverting amplifier input segments 106-1 to either a first intermediate node 112-1 or a second intermediate node 112-2. The second switch circuit 110-2 of the trim select circuit 110 selectively connects the other inverting amplifier input segment 106-2 to either the first intermediate node 112-1 or the second intermediate node 112-2. In general, segmented amplifier inputs 106 can be used having an integer number N segments, where N is greater than 1. The trim select circuit 110 selectively connects each of the N amplifier input segments with one of two or more tap points 126 of a selected group of tap points 126 of the resistor array 114.

The gain select circuit 128 selectively connects one of two or more groups of tap points 126 to the intermediate nodes 112 in order to set the overall PGA gain. The trim select circuit 110 individually interconnects the N segments of the amplifier input 106 with the selected group of tap points according to the trim control code 124. The groups of tap points 126 in the example of FIG. 1 each include two tap points 126. In general, the gain select circuit 128 operates to select one of M groups or sets of tap points of the resistor array, where M is greater than 1. In this manner, the gain select circuit 128 can provide an integer number M nominal gain settings for the PGA circuit 100 according to the gain code 134, and the trim select circuit 110 provides controlled trimming or adjustment of the selected gain value according to the trim code 124.

The trim select circuit 110 operates according to a trim code 124 to connect each of the second input nodes 106 to a selected one of an integer number M tap points of the resistor array circuit 114, where M is greater than 1. In addition, the gain select circuit operates according to a gain code 134 to individually couple a selected group of M of the tap points of the resistor array circuit 114 to the trim select circuit 110 to set the PGA gain. In certain examples, the trim code 124 is adjustable. The trim select circuit 110 may, but need not connect a given one of the intermediate nodes 112 to one or more of the amplifier input segments 106. For example, certain trim codes 124 may correspond to both the input segments 106-1 and 106-2 being connected to only one of the intermediate nodes 112. In certain examples, the trim select circuit 110 operates according to at least one value of the trim code 124 to connect each of the intermediate nodes 112 to at least one of the second input nodes 106. Coding of the trim code 124 provides a wide range of adjustment possibilities to set the feedback voltage applied to the segmented inverting input of the op amp 102.

The PGA circuit 100 in FIG. 1 includes a trim control circuit 120 that provides one or more control signals 122 to operate the switching circuits 110-1 and 110-2 of the trim select circuit 110. The trim control circuit 120 can be any suitable circuit that decodes the trim code 124 and provides corresponding switch control signaling 122 to interconnect the individual amplifier input segments 106-1, . . . 106-N with selected ones of the intermediate nodes 112 via the switching circuits 110-1 and 110-2 according to the trim code 124. The trim code 124 in one example is a word or byte or other set of multiple binary values that can be decoded to generate the switching control signals 122. In another example, the trim code 124 is two binary values stored in corresponding memory cells (not shown), and each binary value of the trim code 124 sets a switch state for the single pole double throw switching circuits 110-1 and 110-2. In the example of FIG. 1, the IC 101 includes a single terminal or multiple terminals allowing an external circuit 142 to program or set the trim code 124. In other examples, the IC 101 includes internal circuitry such as a processor (not shown) that can set and thus adjust the trim code 124. In certain applications, the IC 101 allows the trim code 124 to be programmed or set during manufacturing. The external circuit 142 in one example operates the amplifier at different gain code settings with known input signal levels to measure the resulting output signal and determine appropriate trim code settings 124 for individual manufactured IC products 101. In other examples, the trim switches 110-1 and 110-2 can be one time programmable memory cells, fuses, antifuses, etc., which are programmed during manufacturing.

In certain examples, the gain code 134 is adjustable. The circuit 100 in FIG. 1 includes a gain control circuit 130 that stores the gain code 134 and provides one or more gain control signals 132 to operate switches of the gain select circuit 128. In this example, two single pole, M-throw switch circuits are provided, each having a pole connected to a corresponding one of the intermediate nodes 112, where M=4. The circuit 128 can thus select from M=4 different nominal gain settings according to the gain code 134, and provide one of M sets of two tap connections 126 to the intermediate nodes 112 for selective connection to the segmented amplifier inverting inputs 106-1 and 106-2 according to the trim code 124. In the illustrated example, the IC 101 includes a terminal or multiple terminals to allow an external host circuit 140 to program or otherwise set the gain code 134. As with the trim code 124, the gain code 134 can be a word or byte or other set of multiple binaries that can be decoded to generate the gain control signals 132, or the gain code 134 can be a set of values that can be directly used for controlling the switch circuits of the gain select circuit 128 without requiring decoder circuitry. In other examples, the gain code 134 can be set or adjusted by other circuits within the IC 101 (not shown), In operation, the set of tap points 126 selected according to the gain code 134 determines a nominal value for a first resistor R1 connected between the reference voltage node 118 and the inverting amplifier input 106, and a nominal value for a second resistor R2 connected between the input 106 and the amplifier output 108. The amplifier controls the output voltage $V_{OUT}$ according to the corresponding gain set by the values of R1 and R2 and the input voltage signal $V_{IN}$. FIG. 1 schematically illustrates an example gain selection to connect the second set of tap points 126 from the top to the intermediate nodes 112. In this example, the two selected tap points represent a virtual tap location 116 within one of the resistor segments bounded by the selected tap points. This virtual tap location 116 has a virtual midpoint voltage $V_{MID}$. One of the two selected tap points 126 is higher than the virtual tap 116 and has a voltage $V_{HI}$, and the other is lower with a voltage $V_{LO}$. The trim select circuit 110 uses the split amplifier input segments 106-1 and 106-2 to interpolate a desired feedback node voltage from the two selected tap points 126 and their voltages $V_{HI}$ and $V_{LO}$. Depending on the gain error, the trim code 124 causes the trim select circuit 110 to connect $V_{LO}$ to the gate of X number of input segments 106 and to connect $V_{HI}$ to the remaining (N−X) input segments. This arrangement gives a resolution of (X/N−0.5).(Δ/R1) for the gain, where Δ is the resistance between $V_{LO}$ and $V_{HI}$ as shown in FIG. 1, and R1 is the resistance from $V_{MID}$ to the reference voltage node 108. The value of X∈{1, 2 . . . N−1} is chosen by the digital trim code 124.

Figure 2:
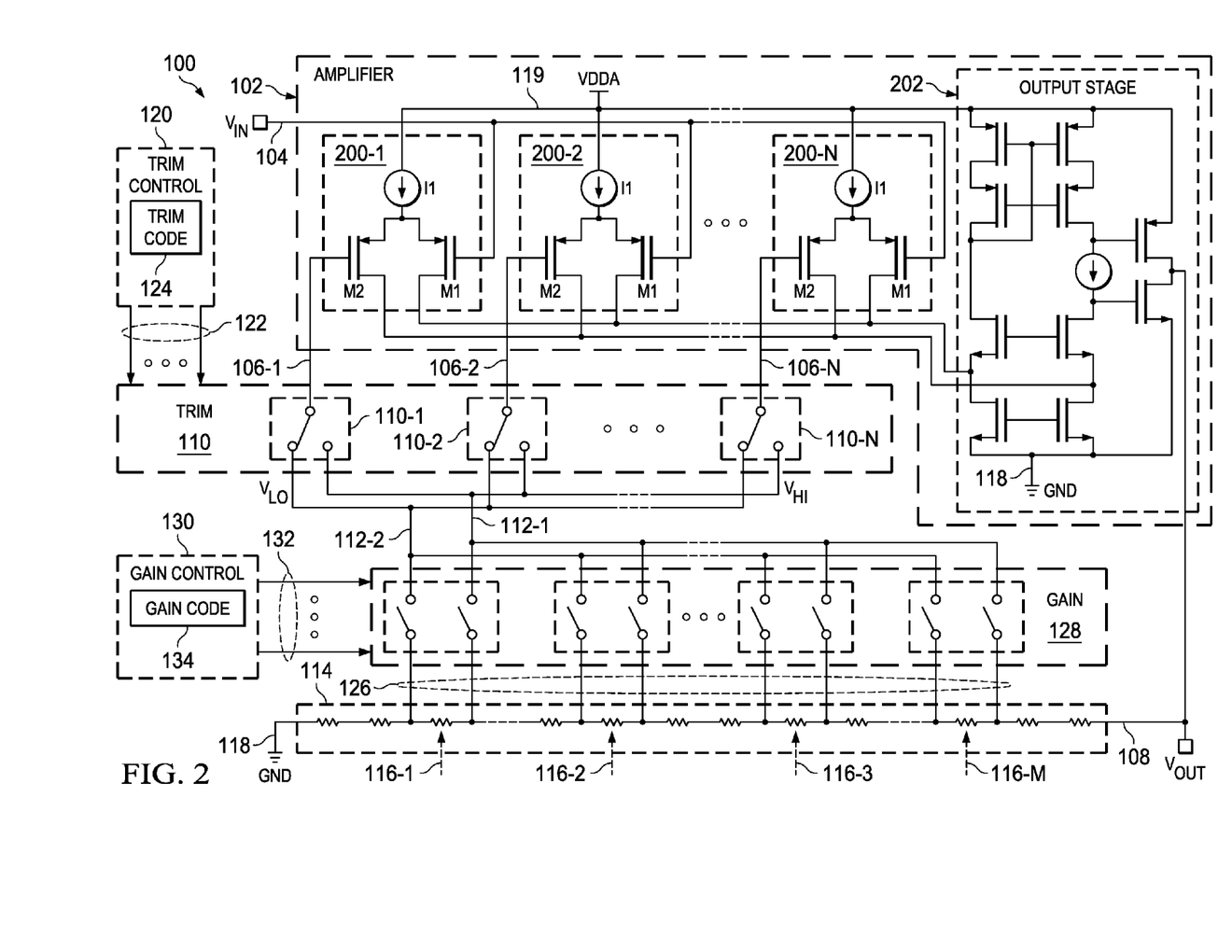
FIG. 2 is a schematic diagram of a programmable gain amplifier circuit with a gain select circuit, a trim select circuit to provide interpolated feedback to a segmented op amp input from a selected set of two resistor array tap points, and multiple differential pair op amp input stages with individual current sources according to an embodiment of the invention.
Figure 3:
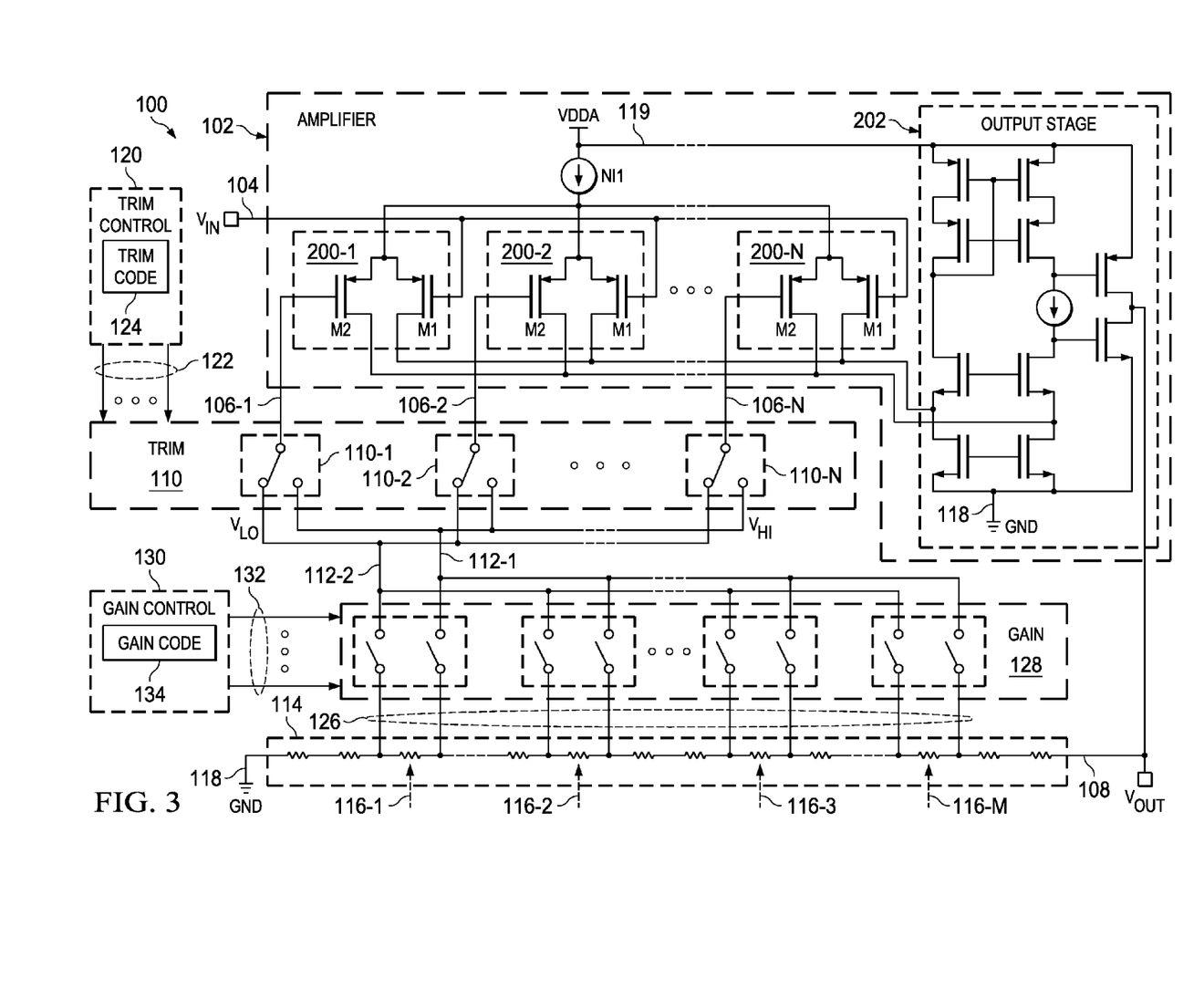
FIG. 3 is a schematic diagram of another example programmable gain amplifier circuit with a gain select circuit, a trim selection circuit to provide interpolated feedback to a segmented op amp input from a selected set of two resistor array tap points, and differential pair op amp input stages sharing a current source according to an embodiment of the invention.

FIGS. 2 and 3 illustrate extension of the PGA amplifier interpolated feedback trim concepts to an integer number N amplifier input segments and an integer number M selectable sets of tap points 126. In this example, the op amp circuit 102 includes an integer number N differential pair circuits 200-1, 200-2, . . . , 200-N. Each individual differential pair circuit 200 includes a first input node 104 and a corresponding one of N second input nodes 106-1, 106-2, . . . , 106-N. The first input nodes 104 are connected together to form the non-inverting first amplifier input 104 to receive the input signal $V_{IN}$. The individual second input nodes 106 are coupled to the corresponding selected intermediate node 112-1 or 112-2 by switching circuits of the trim select circuit 110. In this example, two tap points 126 are provided in each selectable tap group having voltages $V_{HI}$ and $V_{LO}$, respectively. Each of the differential pair circuits 200 in FIG. 2 has a corresponding current source providing a current I1 to a PMOS differential pair, with the sources connected to the current source and the drains connected to corresponding first and second differential outputs connected to an output stage 202. In FIG. 3, the individual differential pair circuits 200 include a PMOS differential pair, and the set of N differential pair circuits 200 have their sources connected to a shared current source providing a current of NI1. The output stage 202 in FIGS. 2 and 3 provides upper current mirrors from the analog supply voltage VDDA and lower current mirrors connected to the reference voltage node 118 (e.g., GND), and a CMOS output stage drives the output signal $V_{OUT}$ at the PGA output node 108. In other examples, NMOS differential pairs can be used with appropriate low side current sources (shared or individual), with the NMOS drains connected to the output stage 202. Other differential pair circuits 200 can be used, for example, including NPN or PNP bipolar transistors. Any suitable output stage circuitry 202 can be used which receives the signal (singled ended or differential) from the segments 200 of the input stage, and which provides the output signal $V_{OUT}$ at the PGA output node 108.

Figure 4:
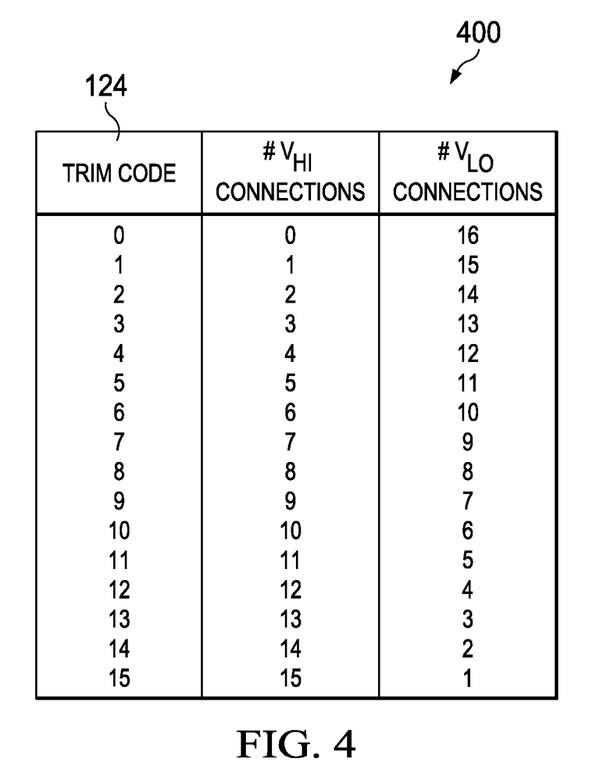
FIG. 4 is a table showing example trim codes and circuit connections for the amplifier circuits of FIGS. 2 and 3.

FIG. 4 shows an example trim code table 400 and circuit connections implemented by the trim control circuit 120 and the trim select circuit 110 for the amplifier circuits 100 of FIGS. 2 and 3. In this example, the table columns represent the number of input pairs that are connected to $V_{HI}$ to $V_{LO}$ for each trim code. In one example for N=16, the upper tap 126 is referred to herein as tap "A" and the lower selected tap 126 is referred to as tap "B". Tap A and tap B are two ends of the minimum allowed resistance segment value in this example, and the respective tap points A and B have voltages $V_A$ and $V_B$. Direct tap connection through switches to a single amplifier input would only allow switched change from tap A to tap B but not any intermediate point since RAB is the minimum resistor segment size. To implement interpolated gain trimming, it is desired to effectively tap the resistor array circuit 114 somewhere between tap A and tap B at a virtual node "V" (e.g., one of the virtual taps 116-1, 116-2, 116-3, . . . 116-M shown in FIGS. 2 and 3). Assuming RBV=RAB×(5/16) in one example, normal switched trimming would require RAB to be split into 16 segments and since RAB is the minimum allowed resistance segment value, such a direct switching solution would require series combinations of 16 RAB segments in parallel. As previously mentioned, this would greatly increase the area of the PGA circuit in the IC 101, and would lead to large parasitic capacitance thereby significantly slowing the response time of the PGA circuit. It is noted in this example for FIGS. 2 and 3 that $V_{IN}=V_{MID}=V_B+(V_A-V_B)\times(5/16)$. Rearranging provides $16V_{IN}=5V_A+11V_B$, and $11(V_{IN}-V_A)+5(V_{IN}-V_B)=0$ to achieve the desired gain. This condition can be satisfied in current domain as follows: $11G_m*(V_{IN}-V_A)+5G_m*(V_{IN}-V_B)=0$, where one of two differential pairs with a transconductance of 11 $G_m$ is connected to a voltage $V_A$ at tap A and the other differential pair with a transconductance of $5G_m$ is connected to a voltage $V_B$ at tap B.

This situation does not use the virtual tap V or its associated virtual voltage $V_V$ directly, but the feedback voltage signal is interpolated from $V_A$ and $V_B$ thus avoiding complexity in the resistor array circuit 114. The value of RAB is decided by the trim range required and the PGA linearity in one example, where higher RAB corresponds to worse linearity because of large change in Vgs for differential pair input transistors. The presently disclosed circuits 100 employ switched interpolation using the trim select circuit 110 to facilitate gain trim to connect discrete selected values $V_A$ or $V_B$ to the segments of the PGA op amp input 106. Where the input 106 is segmented or split into N segments as shown in FIGS. 2 and 3, one side of the differential pair circuit inputs are connected to one of the two feedback tap points A or B of the selected tap group in the resistor array 114 according to the trim code 124. Using the trim control circuit 120, the N=16 segments in FIGS. 2 and 3 can be connected either to $V_{HI}$ or to $V_{LO}$. 'X' number of input pair are connected to $V_{HI}$ and remaining (N−X) input segments are connected to $V_{LO}$, where X is chosen or set by digital trim code 124.

Figure 5:
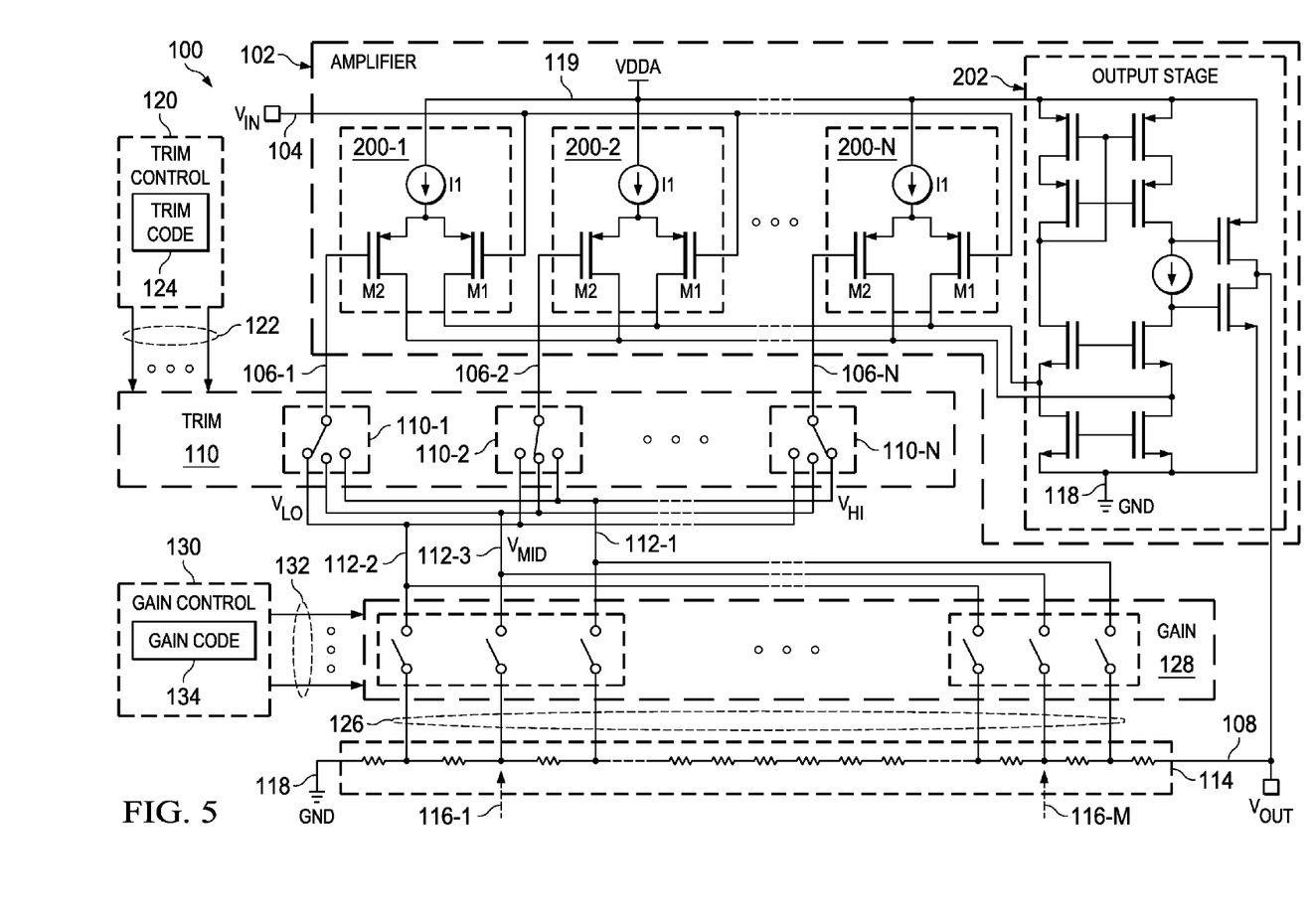
FIG. 5 is a schematic diagram of another programmable gain amplifier circuit with a gain select circuit, a trim selection circuit to provide interpolated feedback to a segmented op amp input from a selected set of three resistor array tap points, and multiple differential pair op amp input stages with individual current sources according to an embodiment of the invention.
Figure 6:
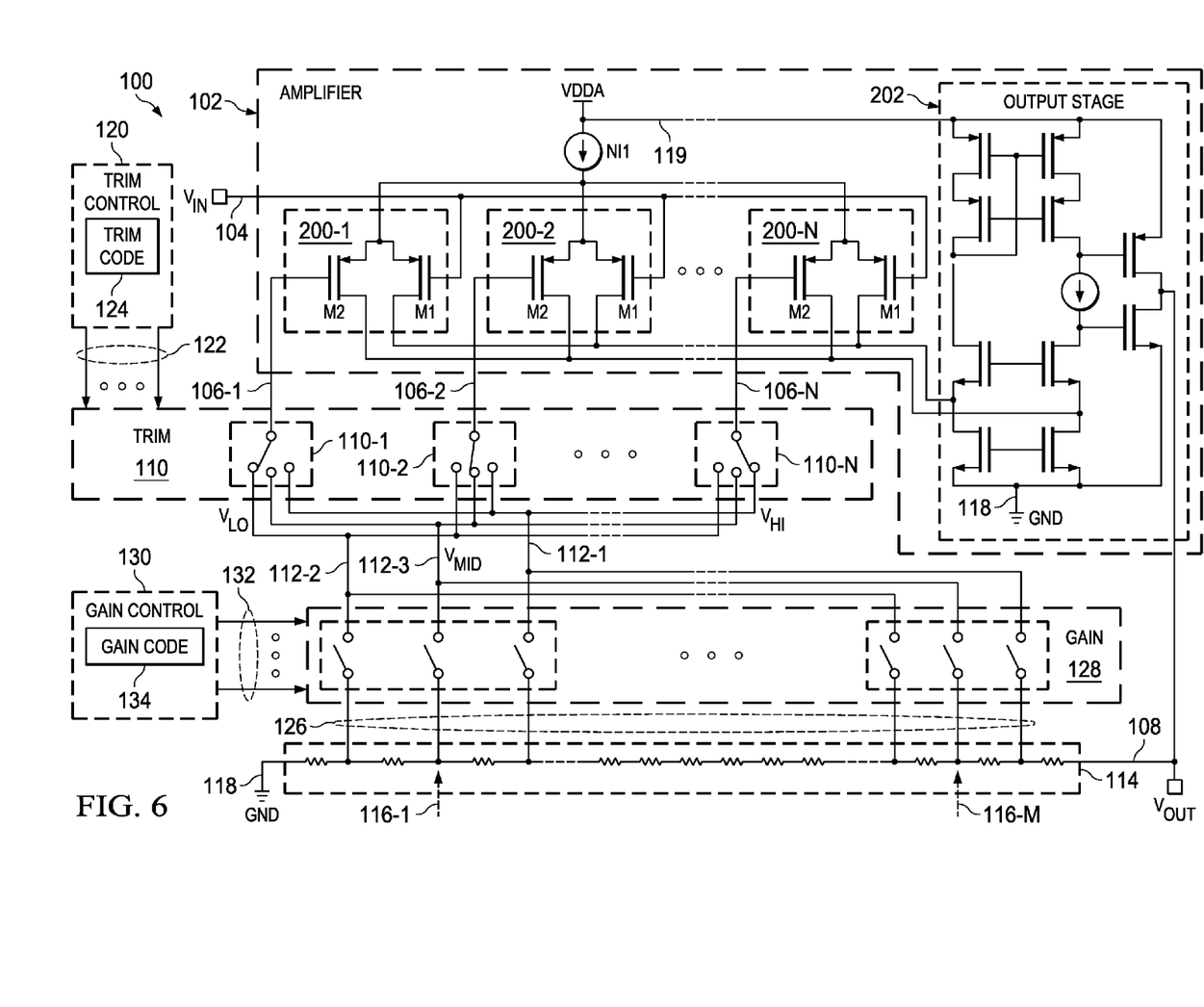
FIG. 6 is a schematic diagram of another programmable gain amplifier circuit with a gain select circuit, a trim selection circuit to provide interpolated feedback to a segmented op amp input from a selected set of three resistor array tap points, and multiple differential pair op amp input stages sharing a current source according to an embodiment of the invention.
Figure 7:
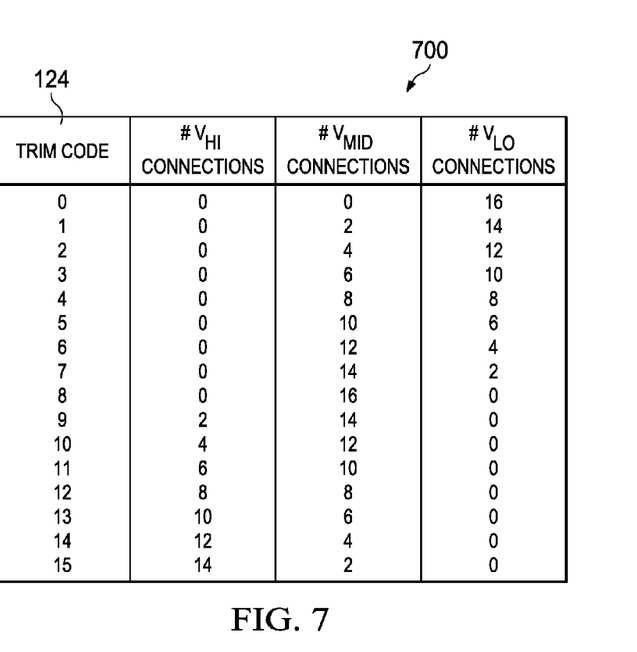
FIG. 7 is a table showing example trim codes and circuit connections for the amplifier circuits of FIGS. 5 and 6.

Referring now to FIGS. 5-7, FIGS. 5 and 6 show extension of the interpolated virtual tapping for gain trimming to sets of three resistor array tap points 126 per gain selection. FIG. 5 shows the PGA circuit 100 including a trim selection circuit 110 to provide interpolated feedback to a segmented op amp input from a selected set of three resistor array tap points 126 using N differential pair op amp input stages 200 with individual current sources, and FIG. 6 illustrated a variant circuit 100 using multiple differential pair op amp input stages 200 sharing a current source. In FIGS. 5 and 6, the gain select circuit 128 connects three selected resistor array tap points 126 to the intermediate nodes 112-1, 112-2 and 112-3 according to the gain code 134. The switching circuits 110-1, 110-2, . . . , 110-N of the trim select circuit 110 selectively connect each of the individual inverting input segments 106-1, 106-2, . . . , 106-N to a selected one of the intermediate nodes 112 according to the trim code 124.

The circuits 100 in FIGS. 5 and 6 provide improved total harmonic distortion (THD) compared to the example of FIGS. 2 and 3. In particular, if $V_{HI}-V_{LO}$ is large in the examples of FIGS. 2 and 3, the interpolation technique may suffer from degraded THD performance of the PGA 100. To mitigate THD degradation, the circuits 100 in FIGS. 5 and 6 also use a third (e.g., middle) tap point 126 with a voltage labeled $V_{MID}$. In one example, $V_{MID}$ is average of $V_{HI}$ and $V_{LO}$, although not a strict requirement of all implementations. The trim select circuit 110 includes single pole triple-throw switching circuits to decode the trim code 124 in one example such that for one half of the trim range, $V_{LO}$ and $V_{MID}$ are used and for the other half, $V_{HI}$ and $V_{MID}$ are used for interpolation. FIG. 7 shows an example trim code table 700 and circuit connections implemented by the trim control circuit 120 and the trim select circuit 110 for the amplifier circuits 100 of FIGS. 5 and 6. In this example, the columns of the table 700 represent, for each trim code, the number of input pairs connected to $V_{HI}$, $V_{MID}$, and $V_{LO}$. In this example, the codes are incremented by 2 in order to retain uniform trim resolution and overall trim range, although other examples are possible that do not require these conditions.

Figure 8:
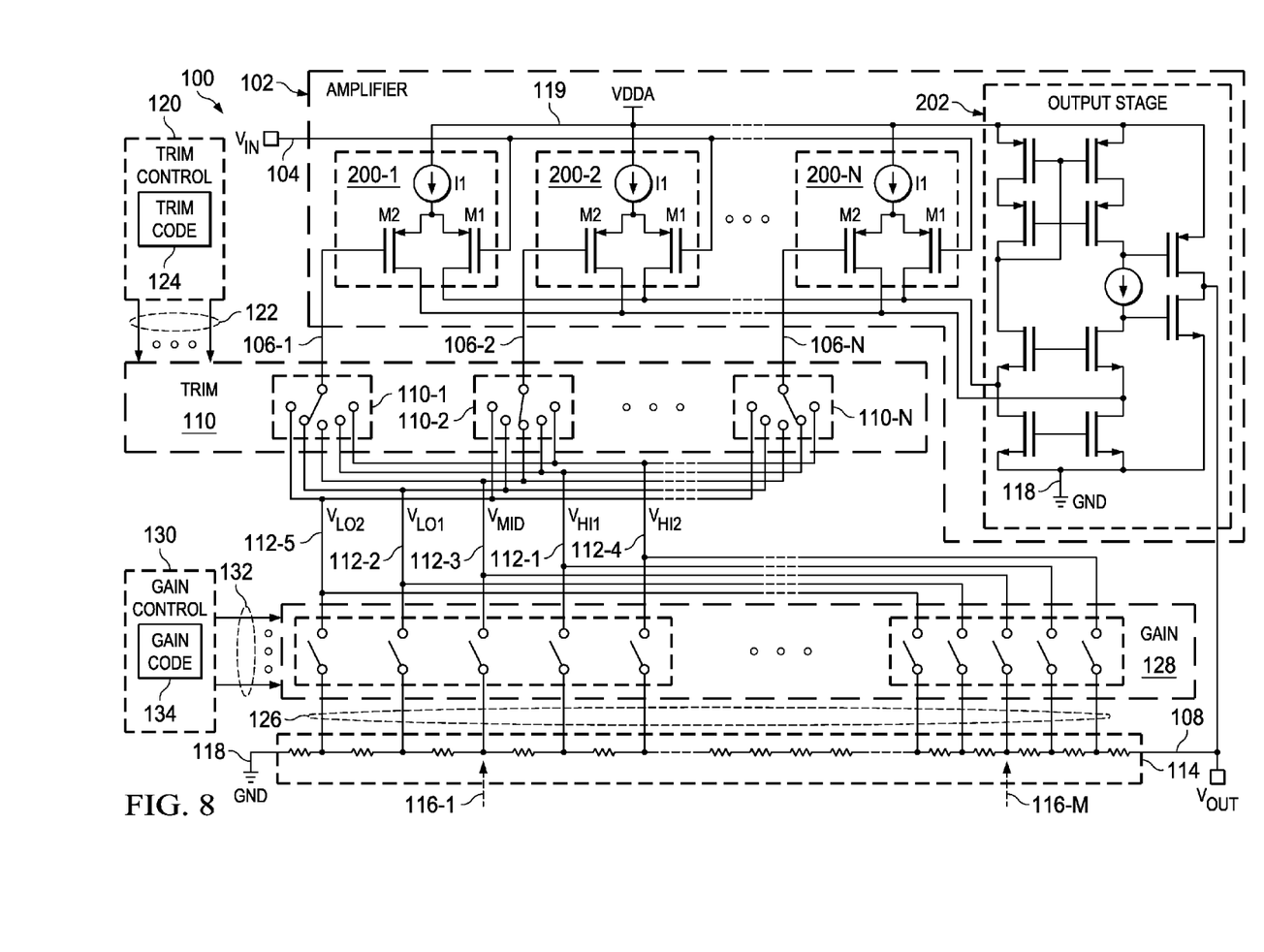
FIG. 8 is a schematic diagram of another programmable gain amplifier circuit with a gain select circuit, a trim selection circuit to provide interpolated feedback to a segmented op amp input from a selected set of five resistor array tap points, and multiple differential pair op amp input stages with individual current sources according to an embodiment of the invention.
Figure 9:
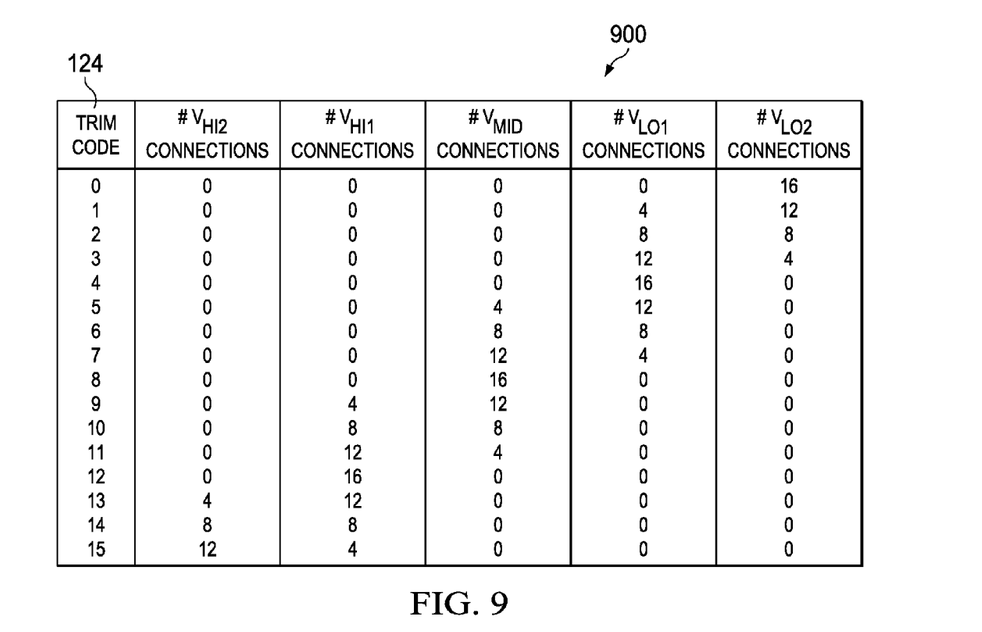
FIG. 9 is a table showing example trim codes and circuit connections for the amplifier circuits of FIG. 8.

FIGS. 8 and 9 respectively show a PGA circuit 100 and a corresponding trim code table 900 that extend the interpolated gain trimming to sets of five resistor array tap points 126 per gain selection. The PGA circuit 100 in FIG. 8 increases the trim range compared to the examples described above. The trim range can be increased by different approaches. One technique includes increasing the tap-tap resistance amount within a selected set of resistor array tap points 126. This approach would increase the difference between $V_{HI}$ and $V_{LO}$, but would worsen the THD. The circuit 100 in FIG. 8 instead uses more tap points 126 per selected set for each gain setting. This example uses five tap points with voltages $V_{HI}$, $V_{LO}$, $V_{MID}$, $V_{HI2}$ and $V_{LO2}$ connected to a set of five intermediate nodes 112-1, 112-2, 112-3, 112-4 and 112-5, respectively. This concept can be extended further to more than five tap points, and practical implementations may be limited only by complexity and additional parasitic capacitances added in the resistor array. In one implementation, the voltage difference between successive tap points is same as in the above examples to provide similar gain trim resolution without degrading THD, while the use of additional tap points expands the trim range. FIG. 9 shows an example trim code table 900 and circuit connections implemented by the trim control circuit 120 and the trim select circuit 110 for the amplifier 100 of FIG. 8. The columns of the table 900 represent the number of input pairs connected to $V_{HI2}$, $V_{HI1}$, $V_{MID}$, $V_{LO1}$, and $V_{LO2}$ for each trim code. In this example, the codes are incremented by 4 to facilitate uniform trim resolution and overall trim range, although other examples are possible that do not require these conditions.

Figure 10:
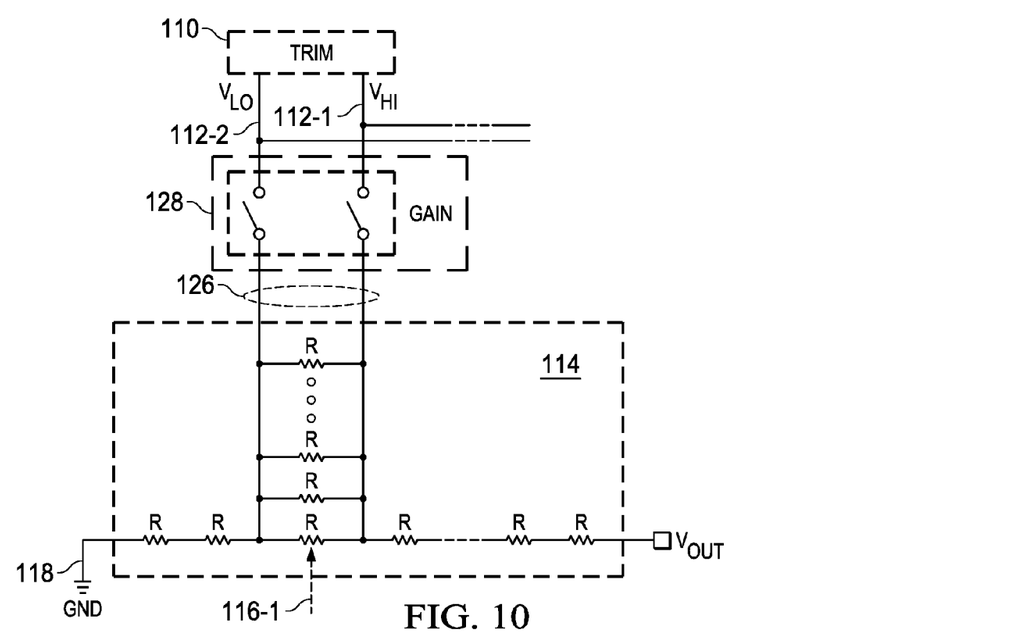
FIG. 10 is a schematic diagram of a resistor array with multiple resistor sections and associated tap points, where some sections include multiple resistors according to an embodiment of the invention.
Figure 11:
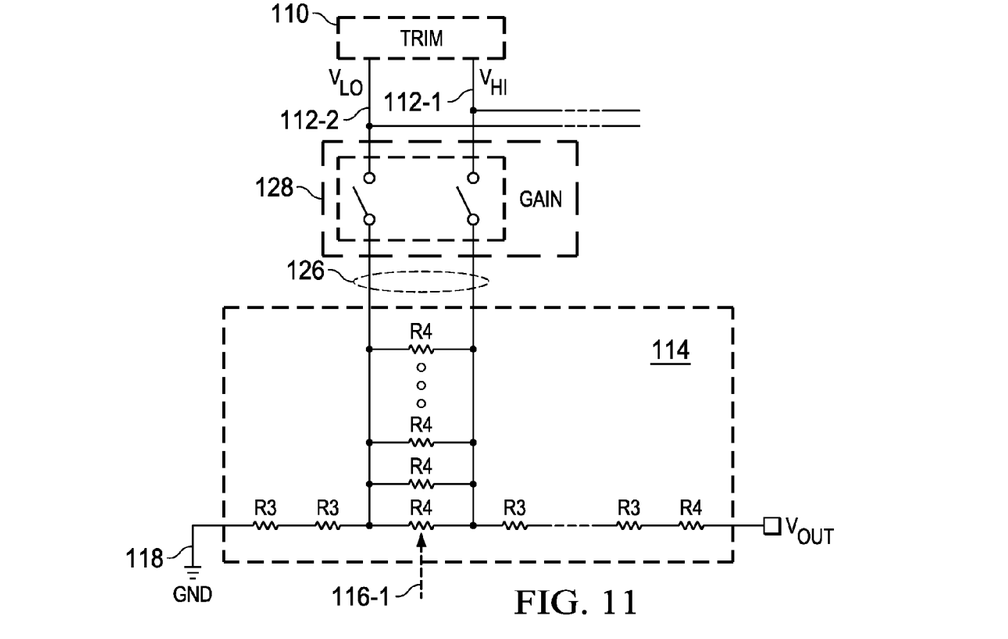
FIG. 11 is a schematic diagram of another resistor array including multiple resistor sections with different numbers of resistors and different resistor values according to an embodiment of the invention.

Referring now to FIGS. 10 and 11, the above interpolated trimming circuits and techniques can be used with a variety of different resistor array circuits 114. In some examples, the resistor sections of the resistor array circuit 114 are of equal resistance values. For example, the resistor array circuit 114 in FIG. 10 includes multiple resistor sections and associated tap points, where some sections include multiple resistors R. In one example, the individual resistors R are constructed to have substantially equal resistance values within integrated circuit manufacturing tolerances (e.g., 125Ω). In FIG. 10, two example tap points 126 are connected to a resistor section having multiple resistors R connected in parallel with one another. This reduces the voltage difference between $V_{HI}$ and $V_{LO}$ to allow low-resolution gain trimming by the trim select circuit 110 as described above, while providing uniformity in construction of the resistors R.

FIG. 11 shows another example resistor array circuit 114 in which at least some of the resistor sections of the resistor array circuit 114 include multiple resistors R4 connected between two of the tap points 126 available for selection by the gain select circuit 128. In addition, the resistor array circuit 114 in FIG. 11 includes resistors having different resistor values R3 or R4. In one non-limiting example, R3=575Ω and R4=60Ω, but other values can be used. For the selectable trim segment bounded by the tap points 126 connected to the gain select circuit 128, one or more resistors R4 of small resistance values are used to allow low-resolution trimming, and the larger resistors R3 are used between selectable tap sets to keep the design and layout simple. In addition, as shown in FIG. 11, more than one of the small resistors R4 can be connected in parallel with one another in the selectable tap sets available for connection by the gain select circuit 128.

Figure 13:
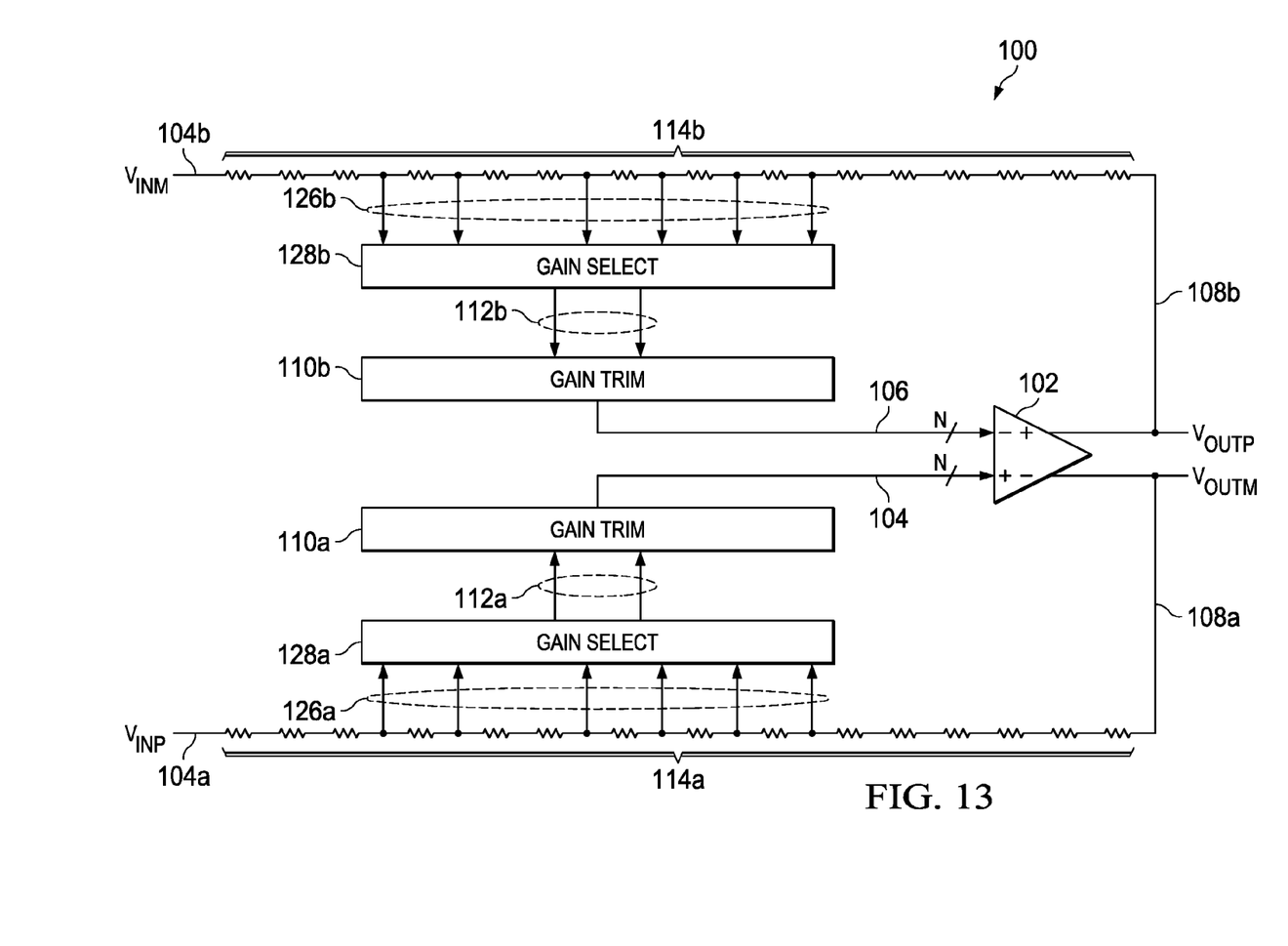
FIG. 13 is a schematic diagram of a differential programmable gain amplifier circuit with first and second trim selection circuits, first and second gain select circuits and first and second resistor arrays to provide interpolated feedback to first and second segmented op amp input according to an embodiment of the invention.
Figure 14:
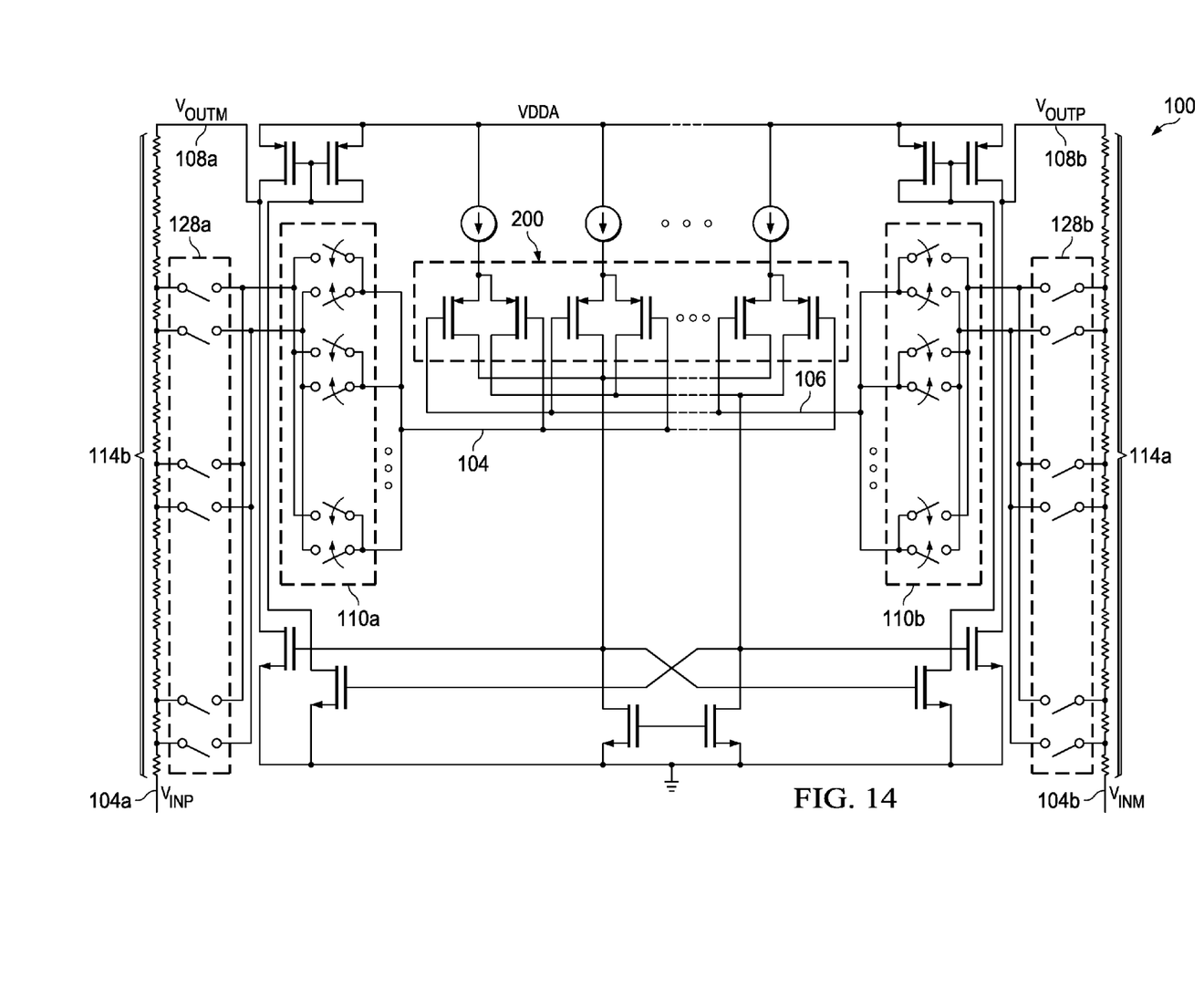
FIG. 14 is a schematic diagram of a differential programmable gain amplifier circuit with first and second trim selection circuits, first and second gain select circuits, first and second resistor arrays to provide interpolated feedback to first and second segmented op amp input with multiple differential pair op amp input stages according to an embodiment of the invention.

Referring also to FIGS. 13 and 14, the above interpolated feedback circuits and techniques can be applied to fully differential PGA circuit configurations. FIG. 13 shows a differential PGA circuit 100 that includes a fully differential amplifier 102 with a segmented first (non-inverting, +) input 104 and a second (inverting, –) input 106. Each of the segmented inputs 104 and 106 includes N segments as described above. The PGA circuit 100 includes first and second trim selection circuits 110a and 110b, as well as first and second gain select circuits 128a and 128b, and corresponding first and second resistor arrays 114a and 114b to provide interpolated feedback to the segmented op amp inputs 104, 106. A positive or "plus" input voltage signal $V_{INP}$ is provided to the first resistor array 114a at an input 104a. A negative or "minus" input voltage signal $V_{INM}$ is provided to the second resistor array 114b at an input 104b. The amplifier 102 provides a differential output signal $V_{OUTP}$, $V_{OUTM}$ at first and second outputs 108b (+) and 108c (–). As described above, the gain select circuits 128 operate according to a gain code (not shown in FIG. 13), and the trim select circuits 110 operate according to a trim code 124. In certain examples, separate first and second trim codes (not shown) can be used for the corresponding first and second trim select circuits 110a and 110b, and separate first and second gain codes (not shown) can be used for the corresponding first and second gain select circuits 128a and 128b. FIG. 14 shows a differential PGA circuit 100 including first and second trim select circuits 110a and 110b, first and second gain select circuits 128a and 128b, as well as first and second resistor arrays 114a and 114b to provide interpolated feedback to first and second segmented op amp inputs 104, 106. Like the examples of FIGS. 2, 3, 5, 6 and 8, the circuit 100 and FIG. 14 includes an integer number N differential pair op amp input stages 200. In this example, the individual differential stages 200 have a corresponding current source, although other implementations can use a shared current source (e.g., as in FIG. 3 above). In the circuit 100 of FIG. 14, moreover, the transistor gates of one side of each of the N differential segments 200 are connected to selected tapping points of the resistor array 114b by the switching circuits of the first trim select circuit 110a to form the segmented input 104, and the other N gates of the other side of the differential segments 200 are connected to tap points of the resistor array 114a by switching circuits of the trim select circuit 110b to form the segmented input 106.

The disclosed examples provide small area solutions for PGA gain trimming using an elegant analog approach for correcting gain error via interpolation. This avoids the need for software post-processing of sampled amplifier output values, and thus avoids increased latency in real-time control applications. The disclosed circuits and techniques also correct gain error at the source which improves the common mode rejection, and the disclosed examples do not require very small resolution in the resistor array circuit 114 for use for gain trimming.

Figure 12:
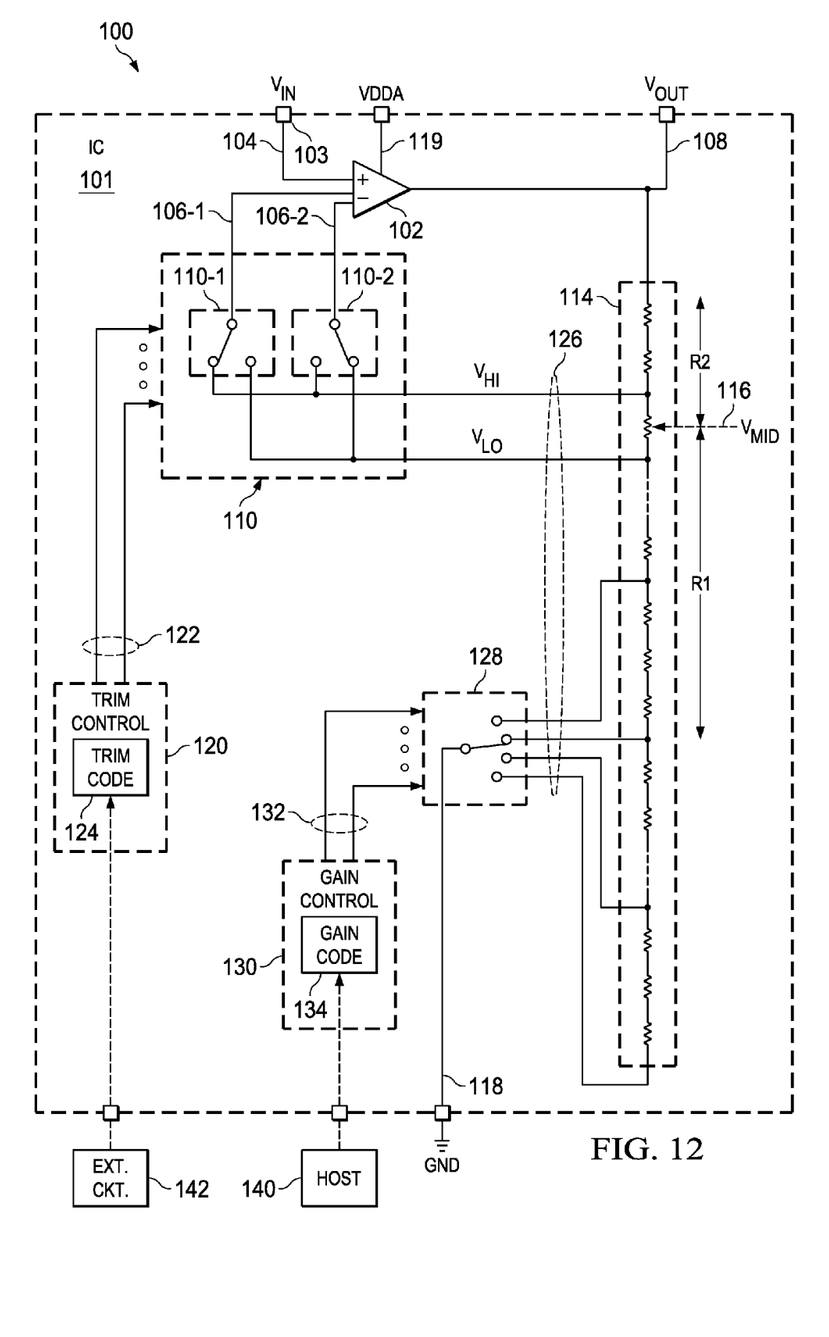
FIG. 12 is a schematic diagram of another programmable gain amplifier circuit with a trim selection circuit to provide interpolated feedback to a segmented op amp input from resistor array tap points, and a separate gain select circuit according to an embodiment of the invention.

FIG. 12 shows another PGA circuit example 100 with a trim selection circuit 110 operating as an analog multiplexer to provide interpolated feedback to the segmented op amp input 106 from resistor array tap points 126, and a separate gain select circuit 130. In this example, the gain control circuit 130 operates independent of the trim control circuit 110. The gain select circuit selectively connects one of several lower tap points 126 to the reference voltage node 118 in order to set the PGA gain. Independently, the trim select circuit 110 selectively connects individual ones of the M input segments 106-1, 106-2 to one of a predetermined set of upper tap points 126 for interpolated trimming (M=2 in this example). This concept can be extended to higher numbers of predetermined trim tapping points 126 (M can be greater than 2), for example, to control THD in the PGA circuit 100. In this example, the upper feedback resistance R2 is generally fixed, subject to trim adjustment by the trim select circuit 110, whereas the gain select circuit 128 operates to multiple predefined values for R1.

The above examples are merely illustrative of several possible embodiments of various aspects of the present disclosure, wherein equivalent alterations and/or modifications will occur to others skilled in the art upon reading and understanding this specification and the annexed drawings. Modifications are possible in the described embodiments, and other embodiments are possible, within the scope of the claims.

The following is claimed:

1. A programmable gain amplifier (PGA) circuit to receive an input signal and to provide an output signal with an adjustable gain, the amplifier circuit comprising:
   an operation amplifier circuit, including:
   a first amplifier input to receive the input signal,
   a second amplifier input including an integer number N second input nodes, N being greater than 1, and
   an amplifier output to provide the output signal;
   a resistor array circuit, including a plurality of resistor sections connected in series with one another between the amplifier output and a reference voltage node, the resistor array circuit including a plurality of tap points individually connected to at least one of the resistor sections;
   a trim select circuit operative according to a trim code to connect each of the second input nodes to a selected one of an integer number M of the tap points of the resistor array circuit, M being greater than 1; and a gain select circuit operative according to a gain code to set a gain of the PGA circuit.

2. The PGA circuit of claim 1, wherein the trim select circuit is operative according to the trim code to connect each of the second input nodes to a selected one of an integer number M intermediate nodes; and wherein the gain select circuit is operative according to the gain code to individually couple the M intermediate nodes to a selected group of M of the tap points of the resistor array circuit to set the gain of the PGA circuit.

3. The PGA circuit of claim 2, wherein the trim code is adjustable.

4. The PGA circuit of claim 2, wherein the trim select circuit is operative according to at least one value of the trim code to connect each of the intermediate nodes to at least one of the second input nodes.

5. The PGA circuit of claim 2, wherein the resistor sections of the resistor array circuit are of equal resistance values.

6. The PGA circuit of claim 2, wherein at least some of the resistor sections of the resistor array circuit include multiple resistors connected between two of the tap points.

7. The PGA circuit of claim 2, wherein M is greater than 2.

8. The PGA circuit of claim 2, wherein the operational amplifier circuit, the trim select circuit, the resistor array circuit and the gain select circuit are fabricated in a single integrated circuit (IC).

9. The PGA circuit of claim 2, wherein the operation amplifier circuit includes an integer number N differential pair circuits, each individual differential pair circuit including a first input node and a corresponding one of the second input nodes; wherein the first input nodes are connected together to form the first amplifier input to receive the input signal; and wherein the individual second input nodes are coupled to the corresponding selected intermediate node by the trim select circuit.

10. An integrated circuit (IC), comprising:
   an input terminal to receive an input signal;
   an operation amplifier circuit, including:
      a first amplifier input coupled with the input terminal to receive the input signal,
      a second amplifier input including an integer number N second input nodes, N being greater than 1, and
      an amplifier output to provide an output signal;
   a resistor array circuit, including a plurality of resistor sections connected in series with one another between the amplifier output and a reference voltage node; and
   a trim select circuit operative according to a trim code to connect each of the second input nodes to a selected one of an integer number M tap points of the resistor array circuit to set a gain of the PGA circuit, M being greater than 1.

11. The IC of claim 10, wherein the trim code is adjustable by an external circuit.

12. The IC of claim 10, wherein M is greater than 2.

13. The IC of claim 10, wherein the operation amplifier circuit includes an integer number N differential pair circuits, each individual differential pair circuit including a first input node and a corresponding one of the second input nodes; wherein the first input nodes are connected together to form the first amplifier input to receive the input signal; and wherein the individual second input nodes are coupled to the corresponding selected intermediate node by the trim select circuit.

14. The IC of claim 10, further comprising a gain select circuit operative according to a gain code to individually couple the M intermediate nodes to a selected group of M of the tap points of the resistor array circuit to set an amplifier gain.

15. An amplifier circuit, comprising:
   an operation amplifier circuit, including:
      a first amplifier input to receive an input signal,
      a second amplifier input including an integer number N second input nodes, N being greater than 1, and
      an amplifier output to provide an output signal;
   a resistor array circuit, including a plurality of resistor sections connected in series with one another between the amplifier output and a reference voltage node, the resistor array circuit including a plurality of tap points individually connected to at least one of the resistor sections; and
   a trim select circuit coupled between the second amplifier input and the resistor array circuit to deliver a feedback voltage signal to each individual one of the second input nodes from a given single one of an integer number M of the tap points of the resistor array circuit, M being greater than 1.

16. The amplifier circuit of claim 15, further comprising a gain select circuit operative according to a gain code to individually couple a selected group of an integer number M of the tap points of the resistor array circuit to the trim select circuit to set a gain of the amplifier circuit.

17. The amplifier circuit of claim 16, wherein the gain code is adjustable.

18. The amplifier circuit of claim 15, wherein the trim select circuit is operative according to an adjustable trim code to deliver the feedback voltage signals to the second input nodes from selected tap points of the resistor array circuit.

19. The amplifier circuit of claim 18, wherein the trim select circuit is operative according to at least one value of the trim code to connect each of a group of the tap points to at least one of the second input nodes.

20. The amplifier circuit of claim 15, wherein the resistor sections of the resistor array circuit are of equal resistance values.

21. The amplifier circuit of claim 15, wherein at least some of the resistor sections of the resistor array circuit include multiple resistors connected between two of the tap points.

22. The amplifier circuit of claim 15, wherein M is greater than 2.

23. The amplifier circuit of claim 15, wherein the operation amplifier circuit includes an integer number N differential pair circuits, each individual differential pair circuit including a first input node and a corresponding one of the second input nodes; wherein the first input nodes are connected together to form the first amplifier input to receive the input signal; and
   wherein the individual second input nodes are coupled to the corresponding selected intermediate node by the trim select circuit.

* * * * *